United States Patent
Ararao et al.

(10) Patent No.: US 7,381,593 B2
(45) Date of Patent: Jun. 3, 2008

(54) METHOD AND APPARATUS FOR STACKED DIE PACKAGING

(75) Inventors: Virgil Cotoco Ararao, Atlanta, GA (US); Harvey Kong, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 422 days.

(21) Appl. No.: 10/913,806

(22) Filed: Aug. 5, 2004

(65) Prior Publication Data
US 2006/0027902 A1 Feb. 9, 2006

(51) Int. Cl.
*H01L 21/00* (2006.01)

(52) U.S. Cl. ............... 438/123; 438/106; 438/107; 438/109; 438/121

(58) Field of Classification Search ........ 438/106–127; 29/830, 831, 834, 835
See application file for complete search history.

(56) References Cited

U.S. PATENT DOCUMENTS

| | | | | |
|---|---|---|---|---|
| 5,420,758 | A * | 5/1995 | Liang | 361/813 |
| 5,643,835 | A * | 7/1997 | Chia et al. | 29/827 |
| 5,867,895 | A * | 2/1999 | Van Beneden et al. | 29/827 |
| 5,963,794 | A | 10/1999 | Fogal et al. | |
| 6,215,193 | B1 | 4/2001 | Tao et al. | |
| 6,603,197 | B1 * | 8/2003 | Yoshida et al. | 257/676 |
| 6,621,155 | B1 * | 9/2003 | Perino et al. | 257/686 |
| 6,955,941 | B2 * | 10/2005 | Bolken | 438/106 |
| 7,247,933 | B2 * | 7/2007 | Juskey et al. | 257/686 |
| 2001/0012526 | A1 * | 8/2001 | Tandy | 425/116 |
| 2002/0096785 | A1 | 7/2002 | Kimura | |
| 2002/0195717 | A1 | 12/2002 | Huang | |
| 2004/0100190 | A1 * | 5/2004 | Kim et al. | 313/504 |
| 2005/0046005 | A1 * | 3/2005 | Bowen | 257/686 |

\* cited by examiner

*Primary Examiner*—Brook Kebede
*Assistant Examiner*—Jae Lee
(74) *Attorney, Agent, or Firm*—Mikio Ishimaru

(57) ABSTRACT

A method and apparatus for stacked die packaging provide a leadframe configured for supporting a lower semiconductor die. At least one pillar is formed on the leadframe for supporting an upper semiconductor die. The pillar is formed integrally with and of the same material as the leadframe, and is sized to have a predetermined height that is higher than the height of such a lower semiconductor die plus the height of bonding wires for such a lower semiconductor die plus a predetermined spacing between such bonding wires and the bottom of an upper semiconductor die to be supported on the at least one pillar.

10 Claims, 12 Drawing Sheets

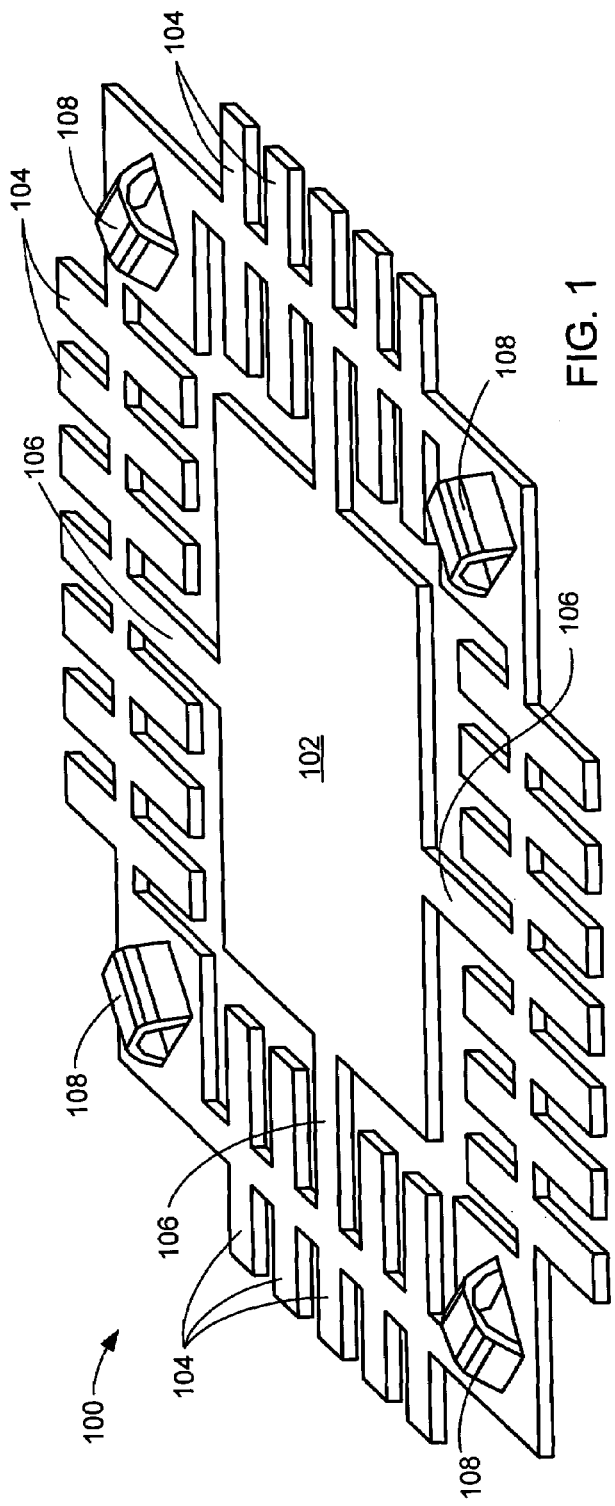
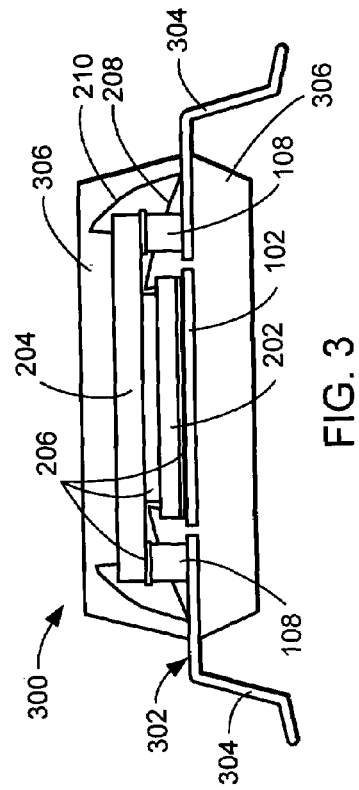
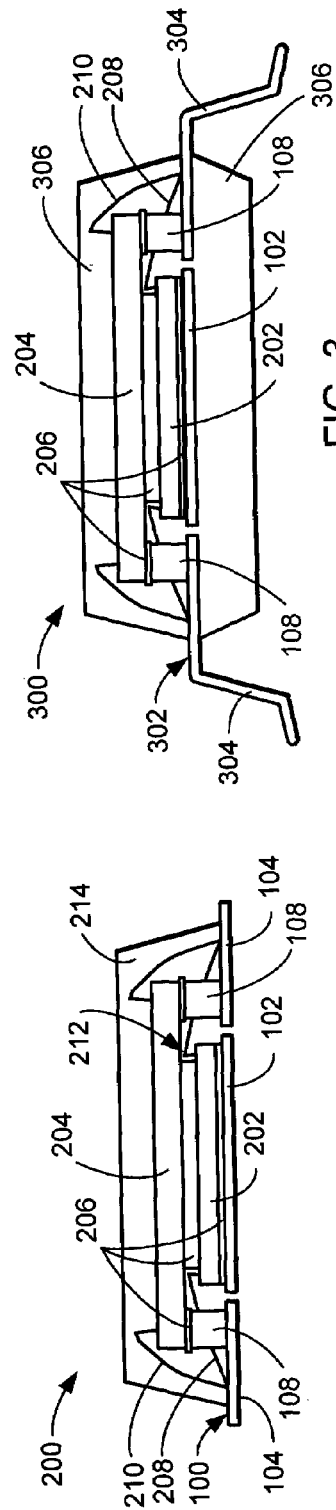
FIG. 1
FIG. 2
FIG. 3

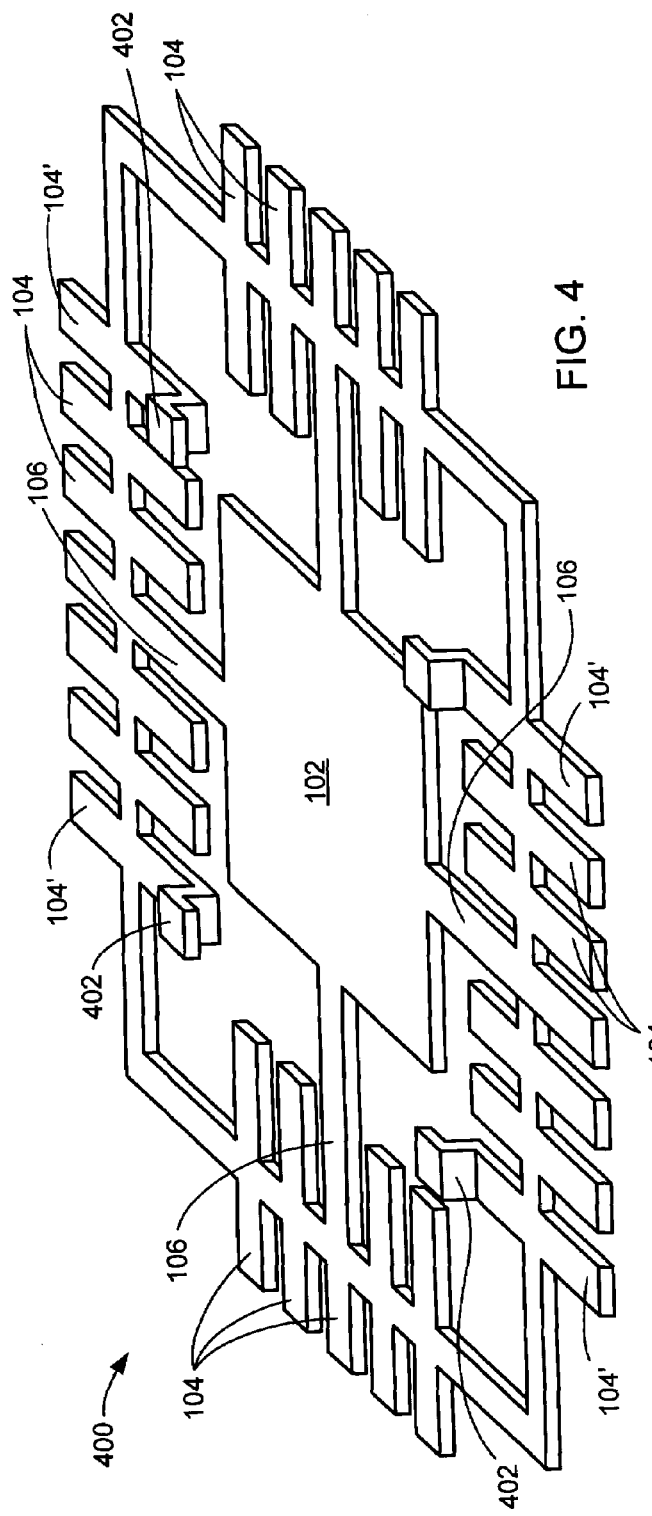
FIG. 4
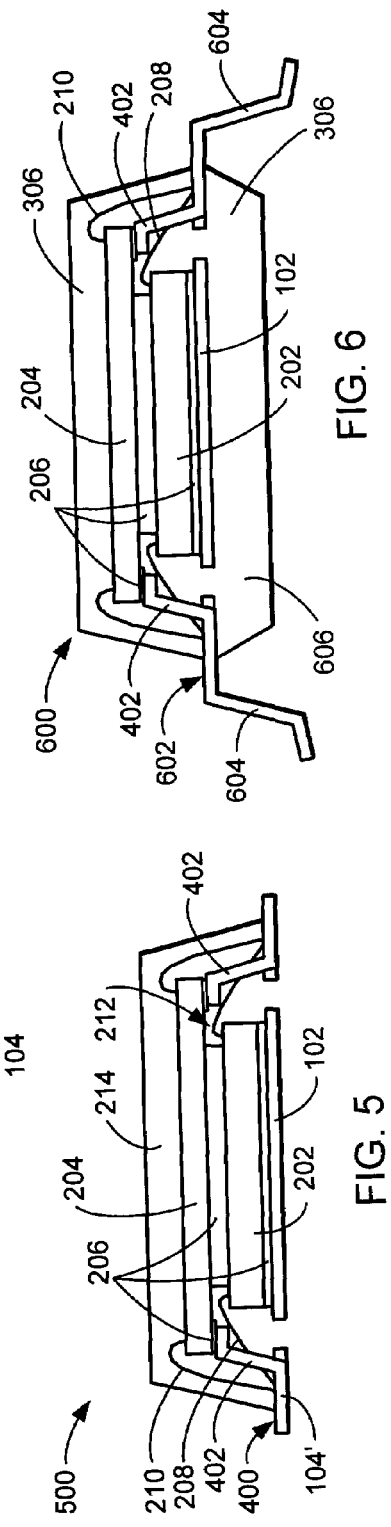
FIG. 6
FIG. 5

METHOD AND APPARATUS FOR STACKED DIE PACKAGING

TECHNICAL FIELD

The present invention relates generally to semiconductor packages, and more particularly to stacked semiconductor assembly packages and methods for the fabrication thereof.

BACKGROUND ART

The computer industry continually strives toward higher performance, lower cost, increased miniaturization of components, and greater packaging density of integrated circuits ("IC's"). As new generations of IC products are released, their functionality increases while the number of components needed to produce them decreases.

Semiconductor devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module substrate that is surrounded by a number of lead fingers. Each die has bonding pads that are then individually connected in a wire-bonding operation to the leadframe's lead fingers using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual dies on a substrate.

To further condense the packaging of individual devices, multi-chip packages have been developed in which more than one device (such as an IC die) can be included in the same package. Of importance to such complicated packaging designs are considerations of input/output lead count, heat dissipation, matching of thermal expansion and contraction between a motherboard and its attached components, costs of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC die that incorporates the same features and functions. Some multi-chip modules consist of a PCB substrate onto which a set of separate IC chip components is directly attached. Other multi-chip modules mount and attach multiple dies on a single leadframe. Following assembly, the multi-chip modules are then encapsulated to prevent damage or contamination. Many such multi-chip modules have greatly increased circuit density and miniaturization, improved signal propagation speed, reduced overall device size and weight, improved performance, and lowered costs—all primary goals of the computer industry.

However, such multi-chip modules can be bulky. IC package density is determined by the area required to mount a die or module on a circuit board. One method to reduce the board size of multi-chip modules is to stack the dies or chips vertically within the module or package. This increases their effective density.

Two of the common die stacking methods are: (a) larger lower die combined with a smaller upper die, and (b) so-called same-size die stacking. With the former, the dies can be very close vertically since the electrical bond pads on the perimeter of the lower die extend beyond the edges of the smaller die on top. With same-size die stacking, the upper and lower dies are spaced more vertically apart to provide sufficient clearance for the wire bonds of the lower die. Then, once the dies are mounted, gold or aluminum bond wires are attached to connect the wire bonding pads on the upper die and on the lower die with the ends of their associated leadframe lead extensions.

Other designs for mounting multiple semiconductor IC chips in a single, multi-chip package have included: a pair of IC dies mounted on opposite sides of a leadframe paddle, two chips mounted on two leadframe paddles, one chip mounted over a paddle and one below mounted on a board, an oblong chip that is rotated and attached on top of another oblong chip attached to a paddle below, one chip attached offset on top of another chip that is attached to a paddle below, one chip attached over another chip by separate spacers between it and the paddle, and various combinations thereof. Such configurations have also been extended to include three or more chips mounted together vertically in a single package.

Unfortunately, such practices for stacked and overlapping dies cause significant limitations for the wire bonding. These stacking arrangements typically entail attaching the upper die onto or immediately above the active surface of the lower die. Such stacking configurations cover or block some or all of the lateral edges of the bonding pads on the lower die. The mounted upper die thus interrupts the wire bond routing for the lower die. As a result, such upper and lower semiconductor dies cannot wire bond simultaneously and completely.

These limitations can be overcome to some extent by supporting the upper die on separate pillars that hold the dies apart at a greater distance. Unfortunately, however, such pillars require extra components and extra assembly, which causes extra material costs, increases processing times, raises assembly costs, and increases overall product costs.

Thus, despite the advantages of recent developments in semiconductor fabrication and packaging techniques, there is a continuing need for improved packaging designs, systems, and methods to enable increased semiconductor die density in multi-chip packages. A need particularly still remains for such improved stacked die structures in which all the active die pads can also be electrically interconnected to the lead fingers simultaneously. In view of the need to increase package efficiency and capacity and to reduce package thicknesses, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method and apparatus for stacked die packaging. A leadframe is provided that is configured for supporting a lower semiconductor die. At least one pillar is formed on the leadframe for supporting an upper semiconductor die. The pillar is formed integrally with and of the same material as the leadframe. The pillar is sized to have a predetermined height that is higher than the height of such a lower semiconductor die plus the height of bonding wires for such a lower semiconductor die plus a predetermined spacing between such bonding wires and the bottom of an upper semiconductor die to be supported on the at least one pillar.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is an isometric view of a leadframe according to the present invention;

FIG. 2 is a side cross-sectional view of a package incorporating the leadframe shown in FIG. 1;

FIG. 3 is a side cross-sectional view of a leaded package incorporating a leadframe similar to the leadframe shown in FIG. 1;

FIG. 4 is an isometric view of another leadframe embodiment according to the present invention;

FIG. 5 is a side cross-sectional view of a package incorporating the leadframe shown in FIG. 4;

FIG. 6 is a side cross-sectional view of a leaded package incorporating a leadframe similar to the leadframe shown in FIG. 4;

BEST MODE FOR CARRYING OUT THE INVENTION

Figure 7:
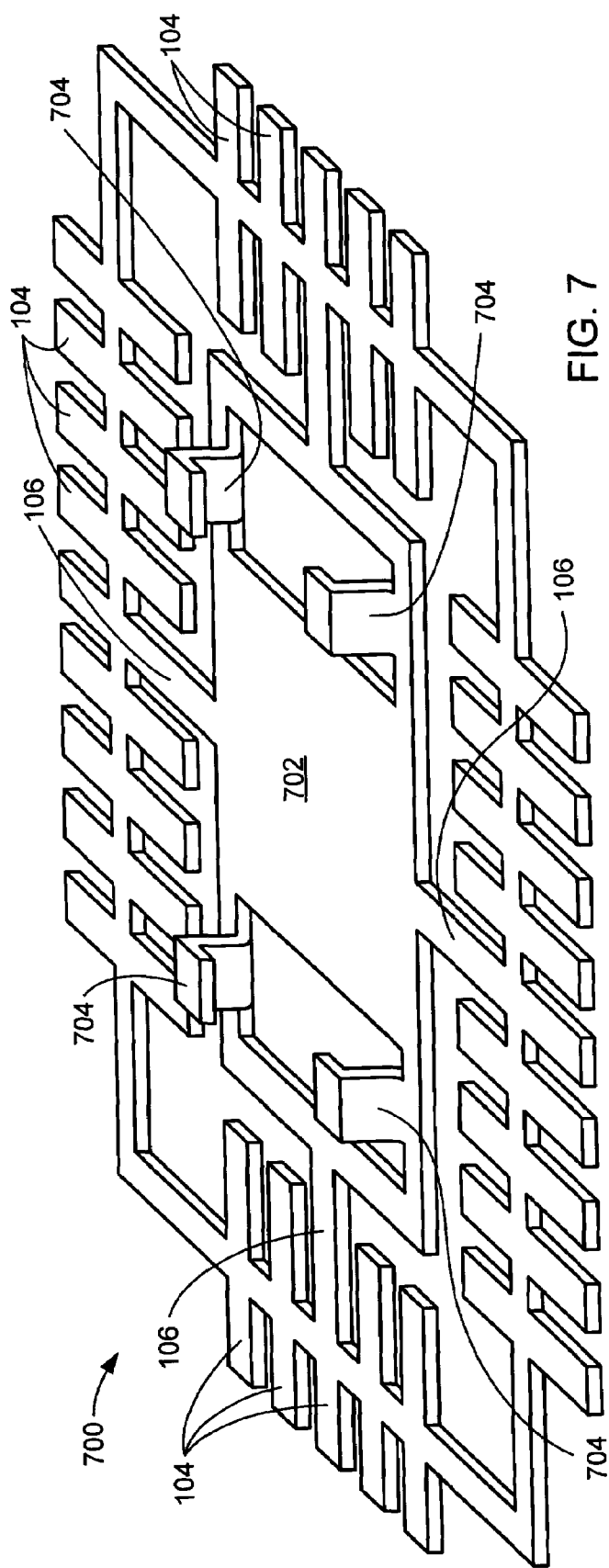
FIG. 7 is an isometric view of still another leadframe embodiment according to the present invention.

In the following description, numerous specific details are given to provide a thorough understanding of the invention. However, it will be apparent that the invention may be practiced without these specific details. In order to avoid obscuring the present invention, some well-known configurations and process steps are not disclosed in detail. Likewise, the drawings showing embodiments of the invention are semi-diagrammatic and not to scale and, particularly, some of the dimensions are for the clarity of presentation and are shown exaggerated in the FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the die attach pad of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The present invention is directed to stacked die packaging and package fabrication methods for stacked dies and/or overlapping dies that are mounted on a leadframe. With existing single-die contemporary designs, all the active pads on the semiconductor die are simultaneously interconnected electrically to the lead fingers on the leadframe. For a stacked die package, therefore, it is particularly important to support and position the stacked die configuration so that all the semiconductor die bonding pads on both dies are accessible and can be connected simultaneously.

Referring now to FIG. 1, therein is shown an isometric view of a leadframe 100 according to the present invention. The leadframe 100 includes a die attach pad 102 in the center thereof for supporting a lower die (not shown, but see the lower semiconductor die 202 in FIGS. 2 and 3). The leadframe 100 also includes leadfingers 104 that are disposed and supported around the periphery of the die attach pad 102 by ground leads 106 extending from the die attach pad 102.

In one embodiment of the present invention illustrated in FIG. 1, pillars 108 are formed in the leadframe 100 for supporting an upper semiconductor die (not shown, but see the upper semiconductor die 204 in FIGS. 2 and 3). In this embodiment, the pillars 108 are created, as by stamping and forming, at four corners (or four sides) of the leadframe 100. The pillars 108 are thus integral with and formed of the same material as the leadframe 100 itself, thereby eliminating the need for, and expense associated with, separate pillars.

The pillars 108 are sized to have a height that is higher than the height of the lower semiconductor die plus the height of the bonding wires for the lower semiconductor die (not shown, but see the bonding wires 208 in FIGS. 2 and 3) plus a desired spacing or gap (not shown, but see the spacing 212 in FIG. 2) between the bonding wires for the lower semiconductor die and the bottom of the upper semiconductor die.

Referring now to FIG. 2, therein is shown a side cross-sectional view of a package 200 incorporating the leadframe 100 according to the present invention. The package 200 may be, for example, a quad leadless package ("QLP") or a quad flat non-leaded ("QFN") package configuration. A lower semiconductor die 202 is supported in the package 200 on the die attach pad 102, and an upper semiconductor die 204 is supported on the pillars 108 above the lower semiconductor die 202. An adhesive 206 secures the lower semiconductor die 202 to the die attach pad 102, the upper semiconductor die 204 to the pillars 108, and the semiconductors dies themselves to each other.

Bonding wires 208 for the lower semiconductor die 202 connect the bonding pads thereof (not shown) to the leadfingers 104 of the leadframe 100. Similarly, bonding wires 210 for the upper semiconductor die 204 connect the bonding pads thereof (not shown) to the leadfingers 104.

The pillars 108 support the upper semiconductor die 204 firmly and steadily above the lower semiconductor die 202 and the bonding wires 208 attached thereto. The pillars 108 have a height sufficient to accommodate the heights of the lower semiconductor die 202 and the bonding wires 208, as well as to allow additional clearance or spacing 212 as may be desired between the bonding wires 208 and the bottom of the upper semiconductor die 204, as illustrated.

The assembly (i.e., the lower and upper semiconductor dies 202 and 204, the bonding wires 208 and 210, and all but the outer perimeter of the leadframe 100) is then packaged in an encapsulant 214 such as a molded plastic or ceramic body.

Referring now to FIG. 3, therein is shown a side cross-sectional view of a leaded package 300 incorporating a leadframe 302 similar to the leadframe 100 (FIG. 1). The components within the leaded package 300 are substantially the same as those in the package 200. The principle difference is in the external package configuration, wherein the leaded package 300 and the leadframe 302 include external leads 304, and the leaded package 300 has an encapsulant 306 shaped appropriately for the accommodation thereof.

Referring now to FIG. 4, therein is shown an isometric view of a leadframe 400 according to the present invention. The leadframe 400 includes a die attach pad 102 in the center thereof for supporting a lower die (not shown, but see the lower semiconductor die 202 in FIGS. 5 and 6). The leadframe 400 also includes leadfingers 104 that are disposed and supported around the periphery of the die attach pad 102 by ground leads 106 extending from the die attach pad 102.

In the leadframe 400, pillars 402 are formed from selected leadfingers 104' of the leadframe 400 for supporting an upper semiconductor die (not shown, but see the upper semiconductor die 204 in FIGS. 5 and 6). In this embodiment, the pillars 402 are created, as by stamping and forming, at four corners of the leadframe 400. The pillars 402 are thus integral with and formed of the same material as the leadframe 400 itself, thereby eliminating the need for, and expense associated with, separate pillars.

The pillars 402 are sized to have a height that is higher than the height of the lower semiconductor die plus the height of the bonding wires for the lower semiconductor die (not shown, but see the bonding wires 208 in FIGS. 5 and 6) plus the desired spacing or gap (not shown, but see the spacing 212 in FIG. 5) between the bonding wires for the lower semiconductor die and the bottom of the upper semiconductor die.

While the pillars 402 in FIG. 4 are positioned substantially at the corners of the leadframe 400, it will be understood, of course, based upon this disclosure, that the pillars 402 may be located on any of the leadfingers 104, at any location on the leadframe 400, as may be desired, needed, and/or appropriate for the application at hand. It will similarly be understood that additional fingers may be sized to provide additional pillars (not shown) at other heights above the die attach pad 102 to support further dies (not shown) above or between the lower and upper semiconductor dies 202 and 204, with appropriate adjustments to the heights of the various pillars as may be needed. Each such set of fingers at each such height will then define a resting plane for the die that is supported thereon at that height. It will also be understood that more or fewer than four pillars may be utilized to form each such resting plane for each such die, as long as the placement and weight of each die are maintained and balanced as appropriate for the application and configuration at hand.

Referring now to FIG. 5, therein is shown a side cross-sectional view of a package 500 incorporating the leadframe 400 according to the present invention. The package 500 may be, for example, a QLP or a QFN package configuration. A lower semiconductor die 202 is supported in the package 500 on the die attach pad 102, and an upper semiconductor die 204 is supported on the pillars 402 above the lower semiconductor die 202. An adhesive 206 secures the lower semiconductor die 202 to the die attach pad 102, the upper semiconductor die 204 to the pillars 402, and the semiconductors dies themselves to each other.

Bonding wires 208 for the lower semiconductor die 202 connect the bonding pads thereof (not shown) to the leadfingers 104 of the leadframe 400. Similarly, bonding wires 210 for the upper semiconductor die 204 connect the bonding pads thereof (not shown) to the leadfingers 104.

The pillars 402 support the upper semiconductor die 204 firmly and steadily above the lower semiconductor die 202 and the bonding wires 208 attached thereto. The pillars 402 have a height sufficient to accommodate the heights of the lower semiconductor die 202 and the bonding wires 208, as well as to allow additional clearance as may be desired between the bonding wires 208 and the bottom of the upper semiconductor die 204, as illustrated.

The assembly (i.e., the lower and upper semiconductor dies 202 and 204, the bonding wires 208 and 210, and all but the outer perimeter of the leadframe 400) is then packaged in an encapsulant 214 such as a molded plastic or ceramic body.

Referring now to FIG. 6, therein is shown a side cross-sectional view of a leaded package 600 incorporating a leadframe 602 similar to the leadframe 400 (FIG. 4). The components within the leaded package 600 are substantially the same as those in the package 500. The principle difference is in the external package configuration, wherein the leaded package 600 and the leadframe 602 include external leads 604, and the leaded package 600 has an encapsulant 306 shaped appropriately for the accommodation thereof.

Referring now to FIG. 7, therein is shown an isometric view of a leadframe 700 according to the present invention. The leadframe 700 includes a die attach pad 702 in the center thereof for supporting a lower die (not shown, but see the lower semiconductor die 202 in FIGS. 8 and 9). The leadframe 700 also includes leadfingers 104 that are disposed and supported around the periphery of the die attach pad 702 by ground leads 106 extending from the die attach pad 702.

Figure 9:
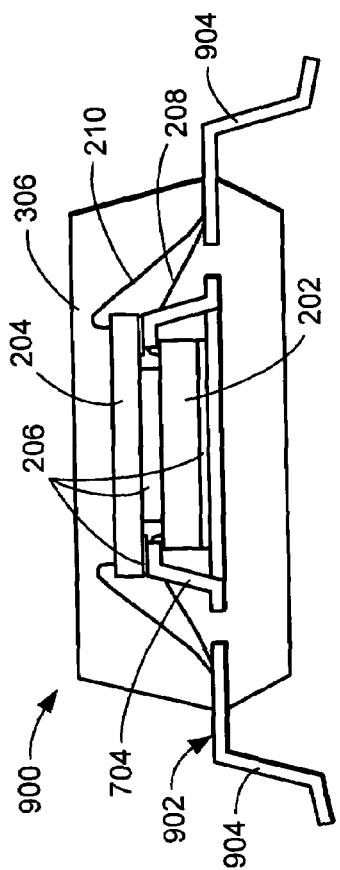
FIG. 9 is a side cross-sectional view of a leaded package incorporating a leadframe similar to the leadframe shown in FIG. 7.
Figure 8:
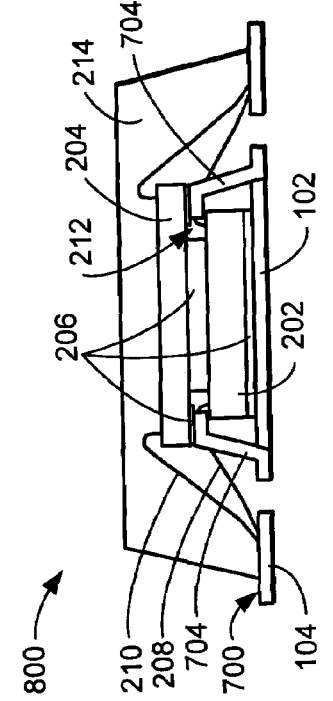
FIG. 8 is a side cross-sectional view of a package incorporating the leadframe shown in FIG. 7.

Pillars 704 are formed in the leadframe 700 for supporting an upper semiconductor die (not shown, but see the upper semiconductor die 204 in FIGS. 8 and 9). In this embodiment, the pillars 704 are created, as by stamping and forming, from the material at four sides (such as the four corners) of the die attach pad 702. The pillars 704 are formed in this manner from the material of the leadframe 700 to stay integral with and attached thereto. In this manner, the expense and need for separate pillars are eliminated.

The pillars 704 are sized to have a height that is higher than the height of the lower semiconductor die plus the height of the bonding wires for the lower semiconductor die (not shown, but see the bonding wires 208 in FIGS. 8 and 9) plus the desired spacing or gap (not shown, but see the spacing 212 in FIG. 8) between the bonding wires for the lower semiconductor die and the bottom of the upper semiconductor die.

In this configuration, the pillars are formed and placed within the die attach pad 702 itself, which is advantageous for accommodating smaller lower semiconductor dies and larger upper semiconductor dies. Thus, while the pillars 704 are illustrated in FIG. 7 as positioned substantially at the corners of the die attach pad 702, it will be understood, based upon this disclosure, that the pillars 704 may be located anywhere on the die attach pad 702, as may be desired, needed, and/or appropriate for the application at hand. It will similarly be understood that the numbers, positions, and widths of the pillars 704 may be varied to provide support as may be required for various forms of upper semiconductor dies positioned thereon. Adequate support can thereby also be afforded for additional semiconductor dies (not shown) positioned upon and supported by such an upper semiconductor die.

Referring now to FIG. 8, therein is shown a side cross-sectional view of a package 800 incorporating the leadframe 700 according to the present invention. The package 800 may be, for example, a QLP or a QFN package configuration. A lower semiconductor die 202 is supported in the package 800 on the die attach pad 702, and an upper semiconductor die 204 is supported on the pillars 704 above the lower semiconductor die 202. An adhesive 206 secures the lower semiconductor die 202 to the die attach pad 702, the upper semiconductor die 204 to the pillars 704, and the semiconductors dies themselves to each other.

Bonding wires 208 for the lower semiconductor die 202 connect the bonding pads thereof (not shown) to the leadfingers 104 of the leadframe 700. Similarly, bonding wires 210 for the upper semiconductor die 204 connect the bonding pads thereof (not shown) to the leadfingers 104.

The pillars 704 support the upper semiconductor die 204 firmly and steadily above the lower semiconductor die 202 and the bonding wires 208 attached thereto. The pillars 704 have a height sufficient to accommodate the heights of the lower semiconductor die 202 and the bonding wires 208, as well as to allow additional clearance as may be desired between the bonding wires 208 and the bottom of the upper semiconductor die 204, as illustrated.

The assembly (i.e., the lower and upper semiconductor dies 202 and 204, the bonding wires 208 and 210, and all but the outer perimeter of the leadframe 700) is then packaged in an encapsulant 214 such as a molded plastic or ceramic body. As illustrated, the bottom of the die attach pad 702, opposite the semiconductor dies, is not so encapsulated but is externally exposed. Since the die attach pad 702 is directly in contact with the lower and upper semiconductor dies 202 and 204 within the package 800, the die attach pad 702 can thereby serve as a thermal pad for the package 800.

Referring now to FIG. 9, therein is shown a side cross-sectional view of a leaded package 900 incorporating a leadframe 902 similar to the leadframe 700 (FIG. 7). The components within the leaded package 900 are substantially the same as those in the package 800. The principle difference is in the external package configuration, wherein the leaded package 900 and the leadframe 902 include external leads 904, and the leaded package 900 has an encapsulant 306 shaped appropriately for the accommodation thereof.

Figure 10:
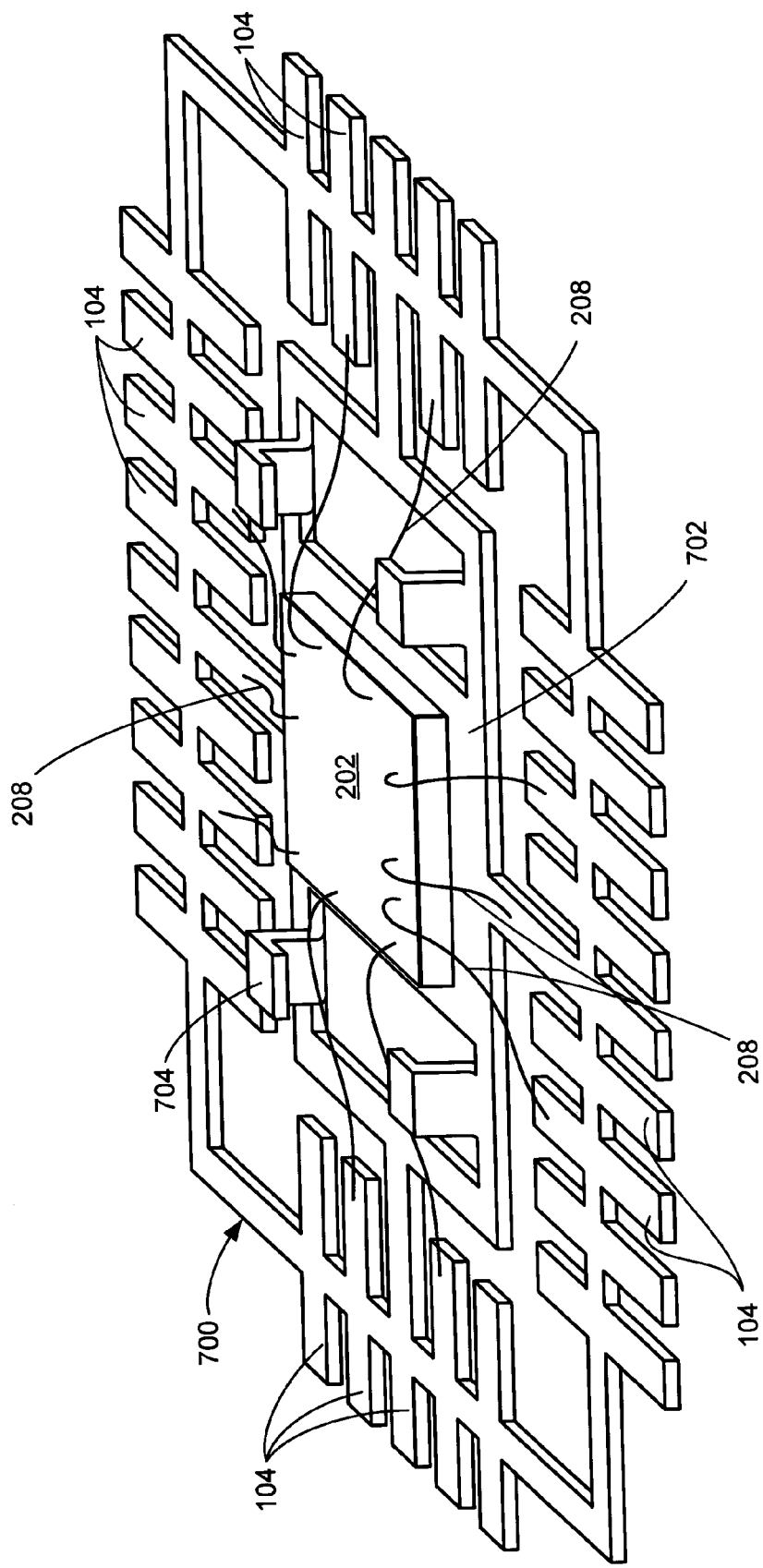
FIG. 10 is an isometric view of the leadframe of FIG. 7 illustrating a wire bonded semiconductor die thereon.

Referring now to FIG. 10, therein is shown an isometric view of the leadframe 700, illustrating the location and formation of the attachment and of the wire bonding of the lower semiconductor die 202 to the leadframe 700. In particular, the lower semiconductor die 202 is shown in position mounted on the die attach pad 702 of the leadframe 700, and the bonding wires 208 are shown connecting the lower semiconductor die 202 to the leadfingers 104 of the leadframe 700. The adhesive 206 (not shown, but see FIG. 8) that attaches the lower semiconductor die 202 to the die attach pad 702 is cured before the bonding wires 208 are attached.

Figure 11:
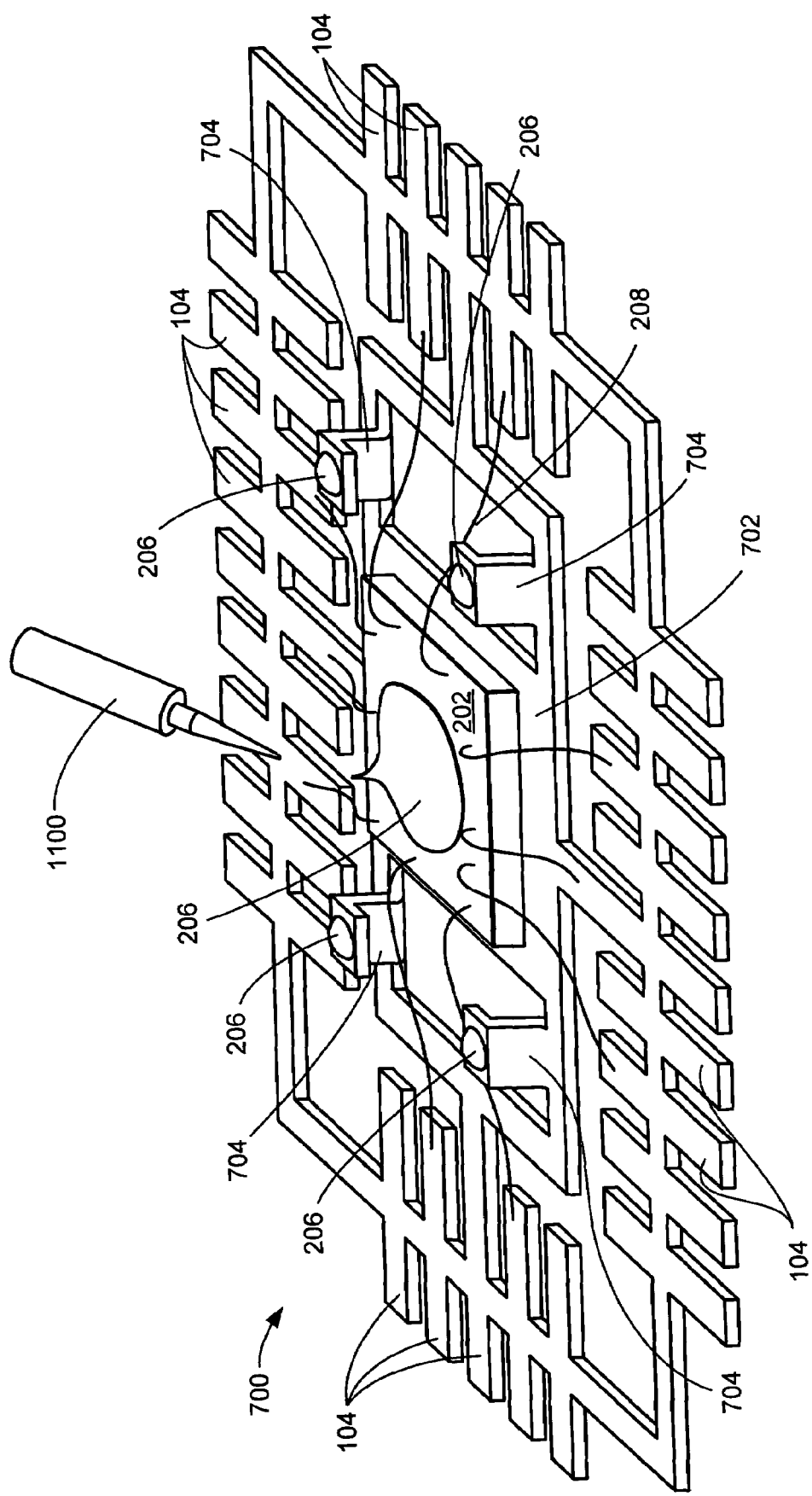
FIG. 11 shows the structure of FIG. 10 with the dispensing thereupon of adhesive.

Referring now to FIG. 11, therein is shown the structure of FIG. 10 illustrating the dispensing thereupon of the adhesive 206. In particular, a dispensing needle 1100 dispenses the adhesive 206 onto the top surfaces of the lower semiconductor die 202 and the pillars 704.

Figure 12:
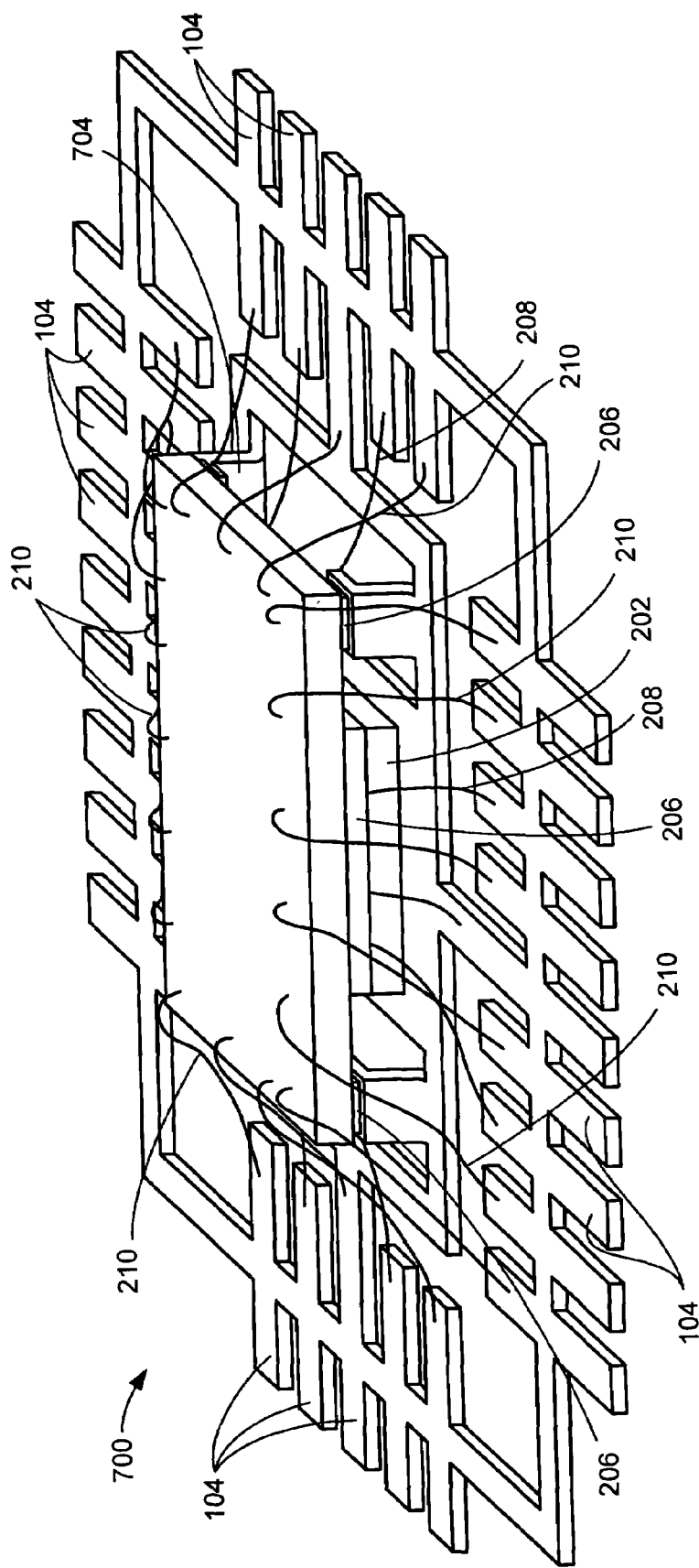
FIG. 12 shows the structure of FIG. 11 with an upper semiconductor die mounted and wire-bonded thereon.

Referring now to FIG. 12, therein is shown the structure of FIG. 11 following positioning and attachment of the upper semiconductor die 204 over the lower semiconductor die 202. As previously described, the upper semiconductor die 204 is secured in place by the adhesive 206. After the adhesive 206 is cured, the upper semiconductor die 204 is wire bonded to the leadframe 700 by attaching the bonding wires 210 between the upper semiconductor die 204 and the leadfingers 104.

Figure 13:
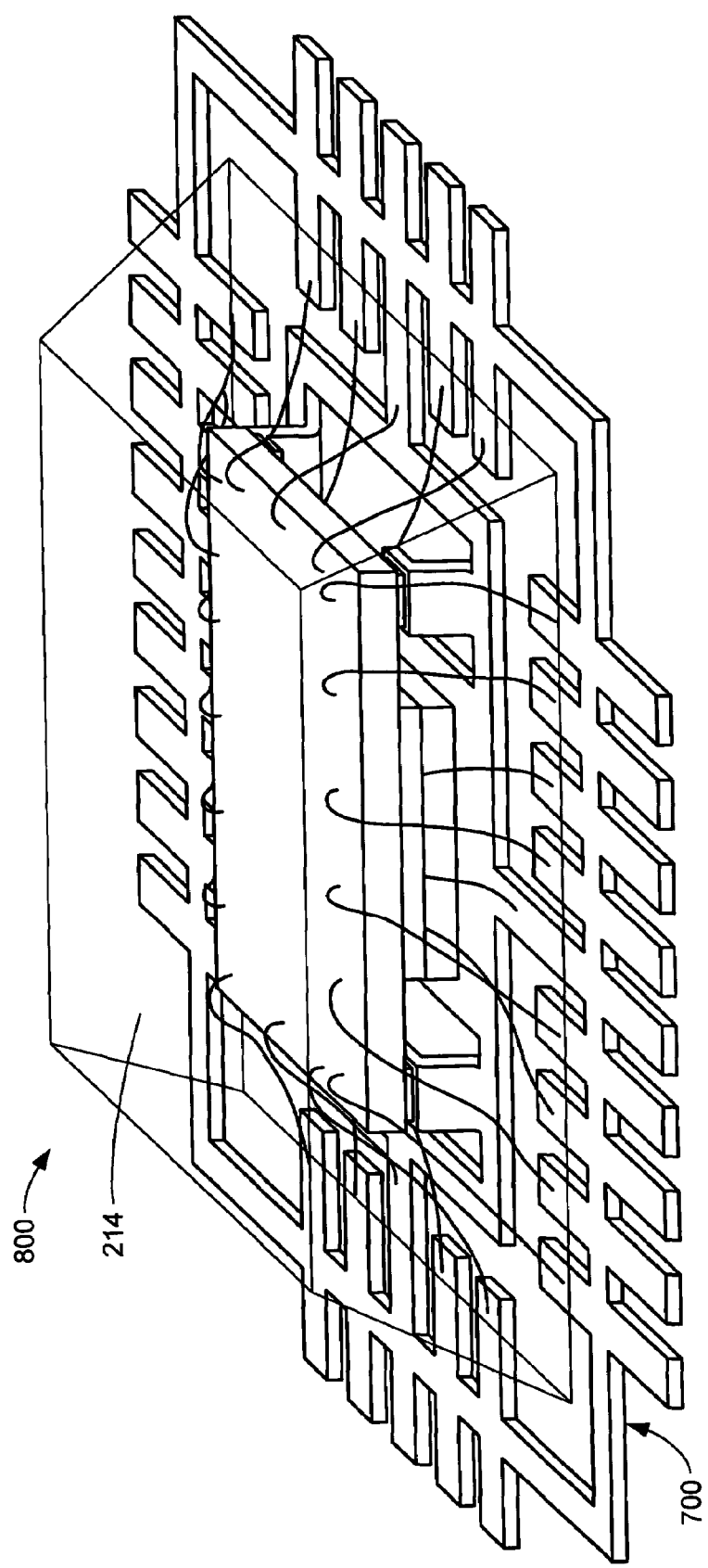
FIG. 13 shows the structure of FIG. 12 following molding of an encapsulant therearound to form a package.

Referring now to FIG. 13, therein is shown the structure of FIG. 12 following molding of the encapsulant 214 therearound to form the package 800 (prior to final trimming of the leadframe 700), such as, for example, a QLP or a QFN package.

Figure 14:
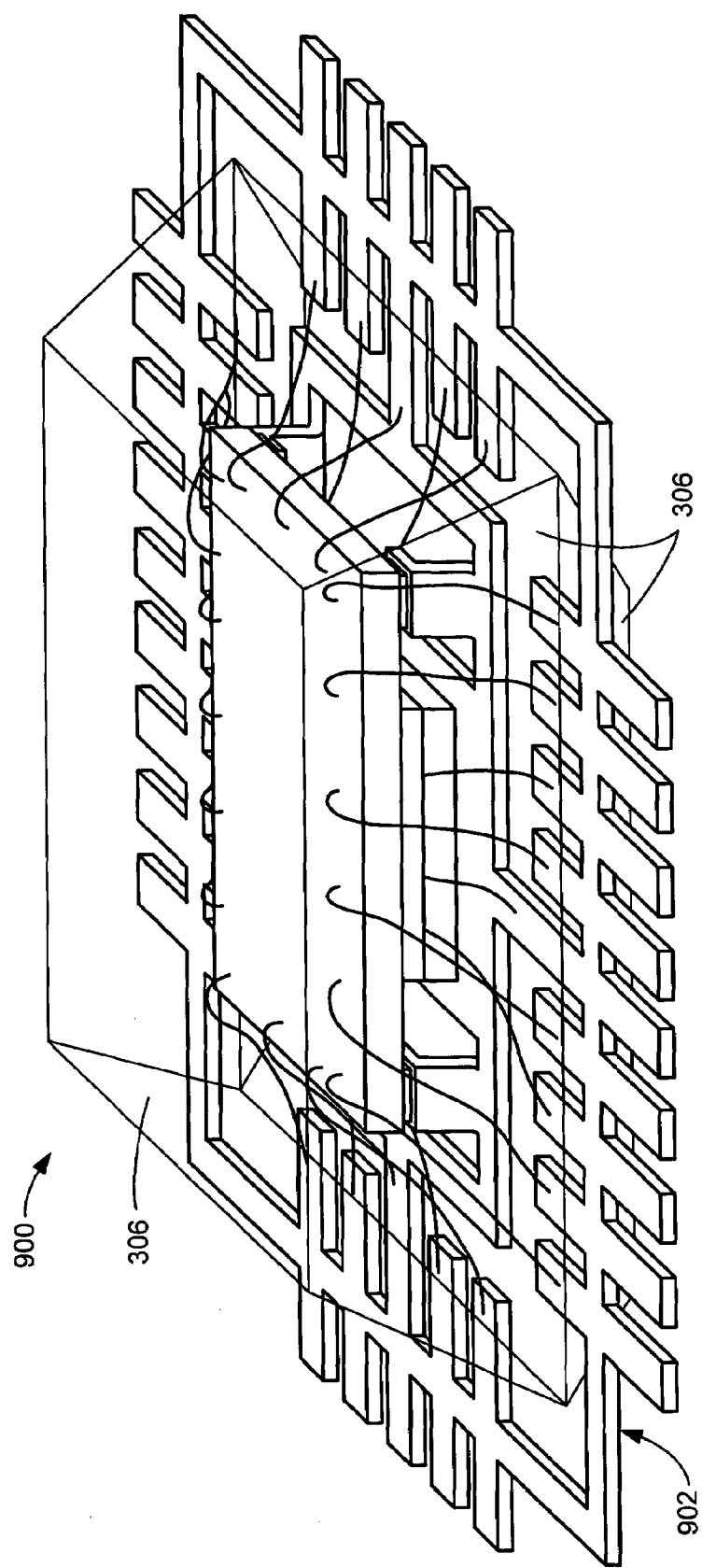
FIG. 14 shows a structure similar to that of FIG. 12 following molding of an encapsulant therearound to form another package configuration.

Referring now to FIG. 14, therein is shown a structure similar to that of FIG. 12, incorporating the leadframe 902, following molding of the encapsulant 306 therearound to form the leaded package 900 (prior to final trimming of the leadframe 902), such as, for example, a molded leaded package.

Figure 15:
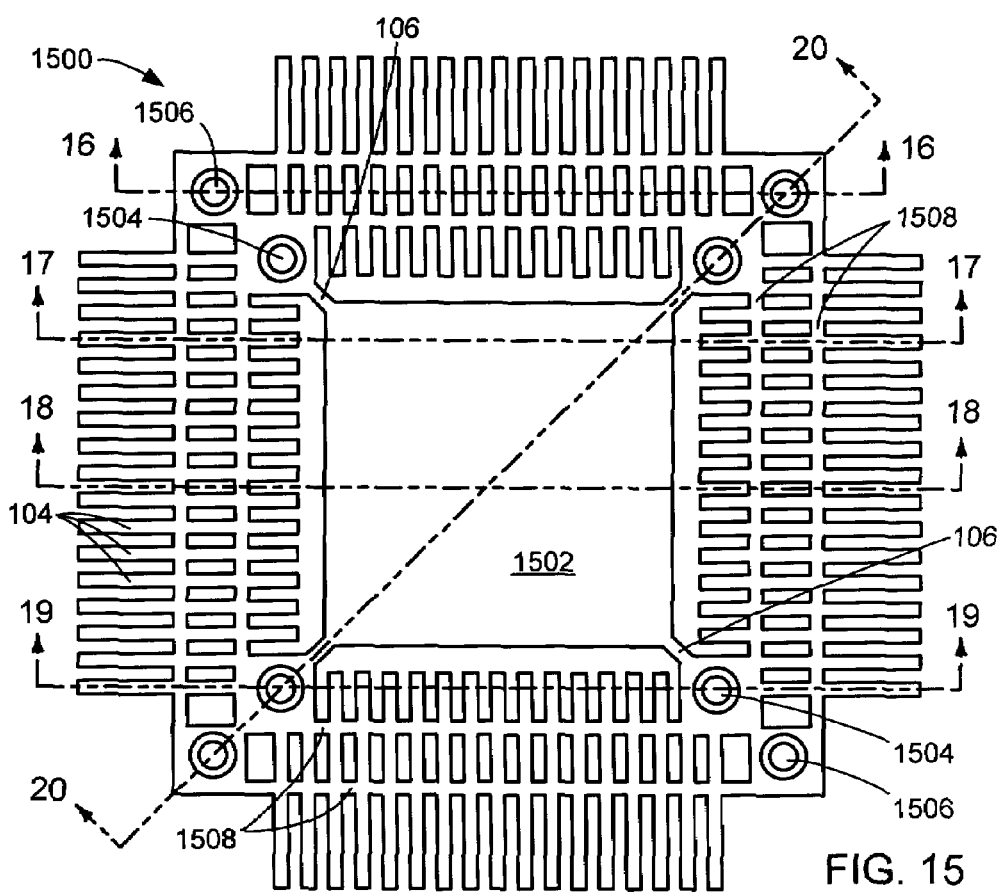
FIG. 15 is a top view of another leadframe embodiment according to the present invention.

Referring now to FIG. 15, therein is shown a top view of a leadframe 1500 according to the present invention. The leadframe 1500 includes a die attach pad 1502 in the center thereof for supporting a lower die (not shown, but see the lower semiconductor die 202 in FIG. 21). The leadframe 1500 also includes leadfingers 104 that are disposed and supported around the periphery of the die attach pad 1502 by ground leads 106 extending from the die attach pad 1502. The die attach pad 1502 can serve as a ground or a thermal pad for QLP or QFN packages, or for leaded package applications.

Figure 21:
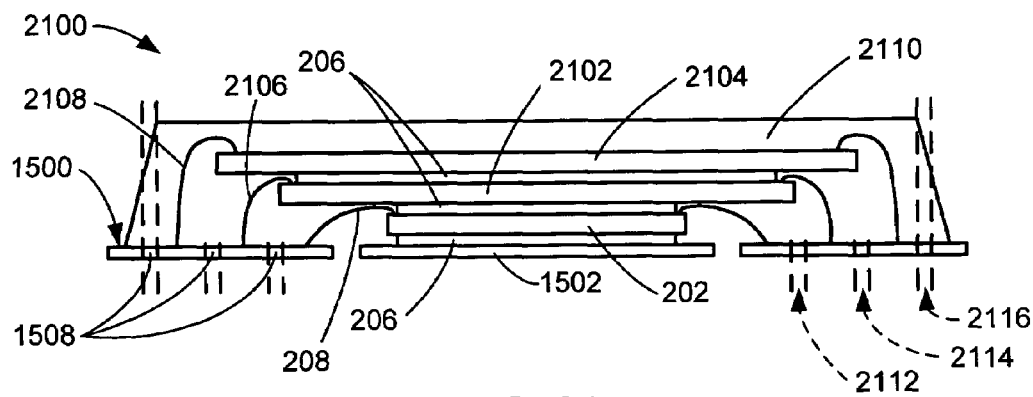
FIG. 21 shows a somewhat figurative cross-sectional view of a package incorporating the leadframe shown in FIG. 15.

Inner pillars 1504 and outer pillars 1506 are formed in the leadframe 1500 for respectively supporting an intermediate semiconductor die and an upper semiconductor die (not shown, but see the intermediate semiconductor die 2102 and the upper semiconductor die 2104 in FIG. 21). In this embodiment, the inner pillars 1504 and the outer pillars 1506 are created, as by stamping and forming, from the leadframe material within the region of the leadfingers 104 (and the tie bars 1508 associated therewith). The inner pillars 1504 are formed in this manner to stay integral with and attached to the leadframe 1500 as an integrated part thereof. The expense and need for separate pillars are accordingly eliminated.

Figure 16:
FIG. 16 is a cross-sectional view of the leadframe shown in FIG. 15 taken on line 16-16 therein.
Figure 19:
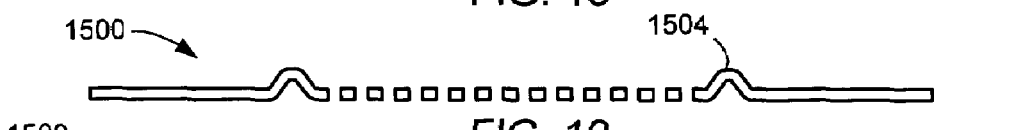
FIG. 19 is a cross-sectional view of the leadframe shown in FIG. 15 taken on line 19-19 therein.
Figure 20:
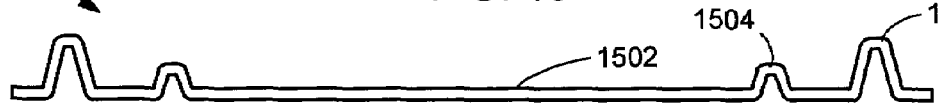
FIG. 20 is a cross-sectional view of the leadframe shown in FIG. 15 taken on line 20-20 therein.

The inner pillars 1504 and the outer pillars 1506 are formed and shaped in a cone configuration, as can be seen in FIGS. 16, 19, and 20. Other shapes may also be considered, according to the needs and applications at hand. For example, in cross section, these would include (but not be limited to) a reverse "L" shape (as illustrated by the pillars 704 in FIG. 7), a reverse "U", a reverse "V", and so forth.

The inner pillars 1504 are sized to have a height that is higher than the height of the lower semiconductor die plus the height of the bonding wires for the lower semiconductor die (not shown, but see the bonding wires 208 in FIG. 21) plus the desired spacing or gap between the bonding wires for the lower semiconductor die and the bottom of the intermediate semiconductor die. This creates space between the lower and intermediate semiconductor dies as may be appropriate or needful for the particular application and configuration at hand.

Similarly, the outer pillars 1506 are sized to have a height that is higher than the height of the inner pillars 1504 plus the height of the intermediate semiconductor die thereon and the height of the bonding wires for the intermediate semiconductor die (not shown, but see the bonding wires 2106 in FIG. 21), plus the desired spacing or gap between the bonding wires for the intermediate semiconductor die and the bottom of the upper semiconductor die. This creates space between the intermediate and upper semiconductor dies as may be appropriate or needful for the particular application and configuration at hand.

Notably, while the inner pillars 1504 and the outer pillars 1506 are illustrated in FIG. 15 as located and positioned substantially at the corners of the leadframe 1500, it will be understood, based upon this disclosure, that the inner pillars 1504 and the outer pillars 1506 may be located anywhere around the die attach pad 1502, as may be desired, needed, and appropriate for the application at hand. It will similarly be understood that the numbers, positions, and dimensions of the inner pillars 1504 and the outer pillars 1506 may be varied to provide support as may be required for various forms and arrangements of intermediate and upper semiconductor dies positioned thereon.

Referring now to FIG. 16, therein is shown a cross-sectional view of the leadframe 1500 taken on line 16-16 in FIG. 15.

Figure 17:
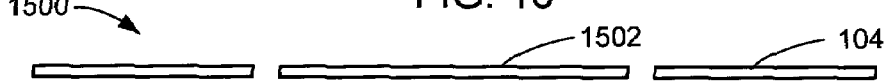
FIG. 17 is a cross-sectional view of the leadframe shown in FIG. 15 taken on line 17-17 therein.

Referring now to FIG. 17, therein is shown a cross-sectional view of the leadframe 1500 taken on line 17-17 in FIG. 15.

Figure 18:
FIG. 18 is a cross-sectional view of the leadframe shown in FIG. 15 taken on line 18-18 therein.

Referring now to FIG. 18, therein is shown a cross-sectional view of the leadframe 1500 taken on line 18-18 in FIG. 15.

Referring now to FIG. 19, therein is shown a cross-sectional view of the leadframe 1500 taken on line 19-19 in FIG. 15.

Referring now to FIG. 20, therein is shown a cross-sectional view of the leadframe 1500 taken on line 20-20 in FIG. 15.

Referring now to FIG. 21, therein is shown a somewhat figurative cross-sectional view of a package 2100, such as a molded stacked die QLP or QFN package, incorporating the leadframe 1500 according to the present invention. A lower semiconductor die 202 is supported in the package 2100 on the die attach pad 1502. An intermediate semiconductor die 2102 is supported on the inner pillars 1504 (not shown, but see the inner pillars 1504 in FIG. 25) above the lower semiconductor die 202. An upper semiconductor die 2104 is supported on the outer pillars 1506 (not shown, but see the outer pillars 1506 in FIG. 25) above the intermediate semiconductor die 2102. An adhesive 206 secures the lower semiconductor die 202, the intermediate semiconductor die 2102, and the upper semiconductor die 2104 in position.

Bonding wires 208 for the lower semiconductor die 202 connect the bonding pads thereof (not shown) to the leadfingers 104 of the leadframe 100. Similarly, bonding wires 2106 for the intermediate semiconductor die 2102 and bonding wires 2108 for the upper semiconductor die 2104 connect the bonding pads (not shown) of the respective semiconductor dies to the leadfingers 104. Proper and sufficient spacing for these elements is provided by the corresponding heights of the inner and outer pillars 1504 and 1506, as described above.

The assembly (i.e., the lower, intermediate, and upper semiconductor dies 202, 2102, and 2104, the bonding wires 208, 2106, and 2108, and all but the outer perimeter of the leadframe 1500) is then packaged in an encapsulant 2212 such as a molded plastic or ceramic body. The package 2100 is illustrated in FIG. 21 in the stage immediately following molding of the encapsulant 2212, and before completion of the package 2100.

For completing the package 2100, saw streets 2112 and 2114, illustrated in phantom, show regions where the package 2100 is finished by sawing along and through the tie bars 1508 to separate individual leads of the leadfingers 104. Saw streets 2116 show regions where the package is finished by sawing through the entire height of the package 2100 to remove the outer extremities of the leadfingers 104 and the outer edges of the encapsulant 2212.

The method and technique described with respect to the leadframe 1500 and the package 2100 are particularly applicable to QLP and QFN configurations, and illustrate stacking, according to the present invention, for multi-input/output multi-die packaging.

Figure 22:
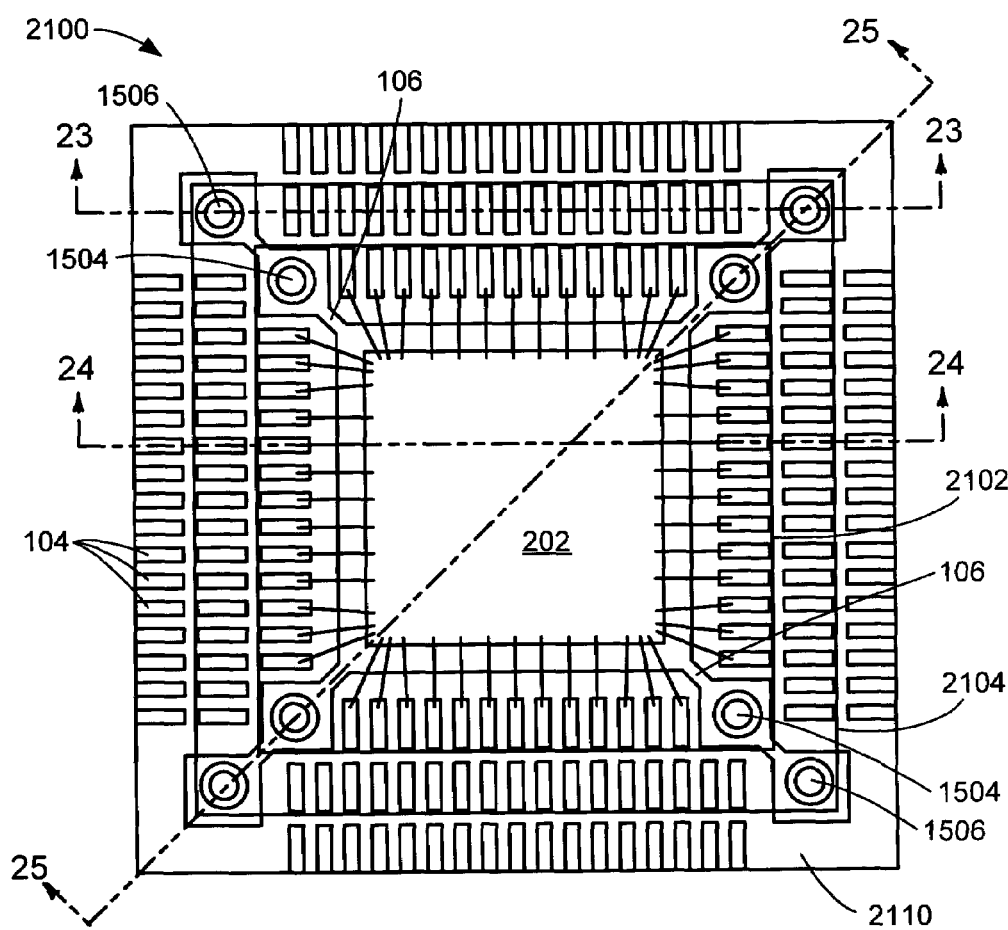
FIG. 22 shows a figurative top view of the package shown in FIG. 21 following finishing thereof.

Referring now to FIG. 22, therein is shown a figurative top view of the package 2100 shown in FIG. 21, following completion thereof by sawing the saw streets 2112, 2114, and 2116 as described above. For clarity of illustration, some elements have been omitted, and the encapsulant 2212, the intermediate semiconductor die 2102, and the upper semiconductor die 2104 are shown as transparent so that the relationships among the features of the package 2100 can be more readily appreciated.

Figure 23:
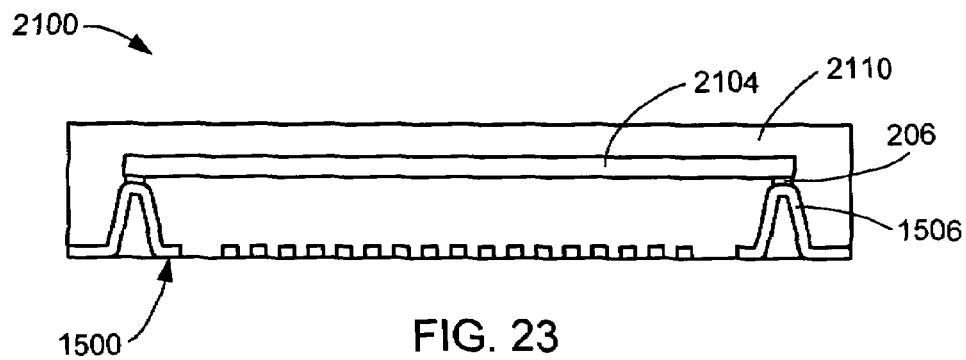
FIG. 23 is a cross-sectional view of the leadframe shown in FIG. 22 taken on line 23-23 therein.

Referring now to FIG. 23, therein is shown a cross-sectional view of the completed package 2100 taken on line 23-23 in FIG. 22.

Figure 24:
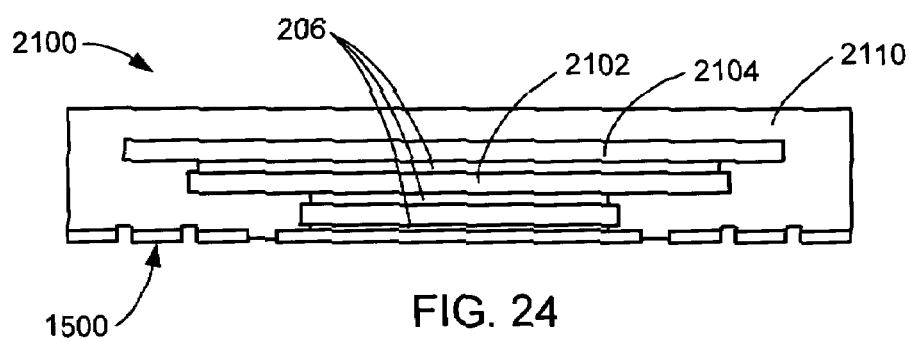
FIG. 24 is a cross-sectional view of the leadframe shown in FIG. 22 taken on line 24-24 therein.

Referring now to FIG. 24, therein is shown a cross-sectional view of the completed package 2100 taken on line 24-24 in FIG. 22.

Figure 25:
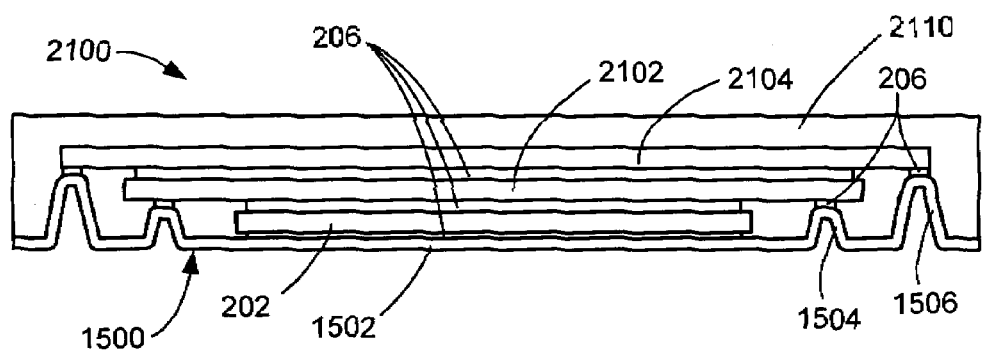
FIG. 25 is a cross-sectional view of the leadframe shown in FIG. 22 taken on line 25-25 therein.

Referring now to FIG. 25, therein is shown a cross-sectional view of the completed package 2100 taken on line 25-25 in FIG. 22. As shown therein, the inner pillars 1504 and the outer pillars 1506 have been sized, as described above, to have respective predetermined heights for supporting the upper semiconductor die 2104 and the intermediate semiconductor die 2102 with the intermediate semiconductor die 2102 between the upper semiconductor die 2104 and the lower semiconductor die 202.

Figure 26:
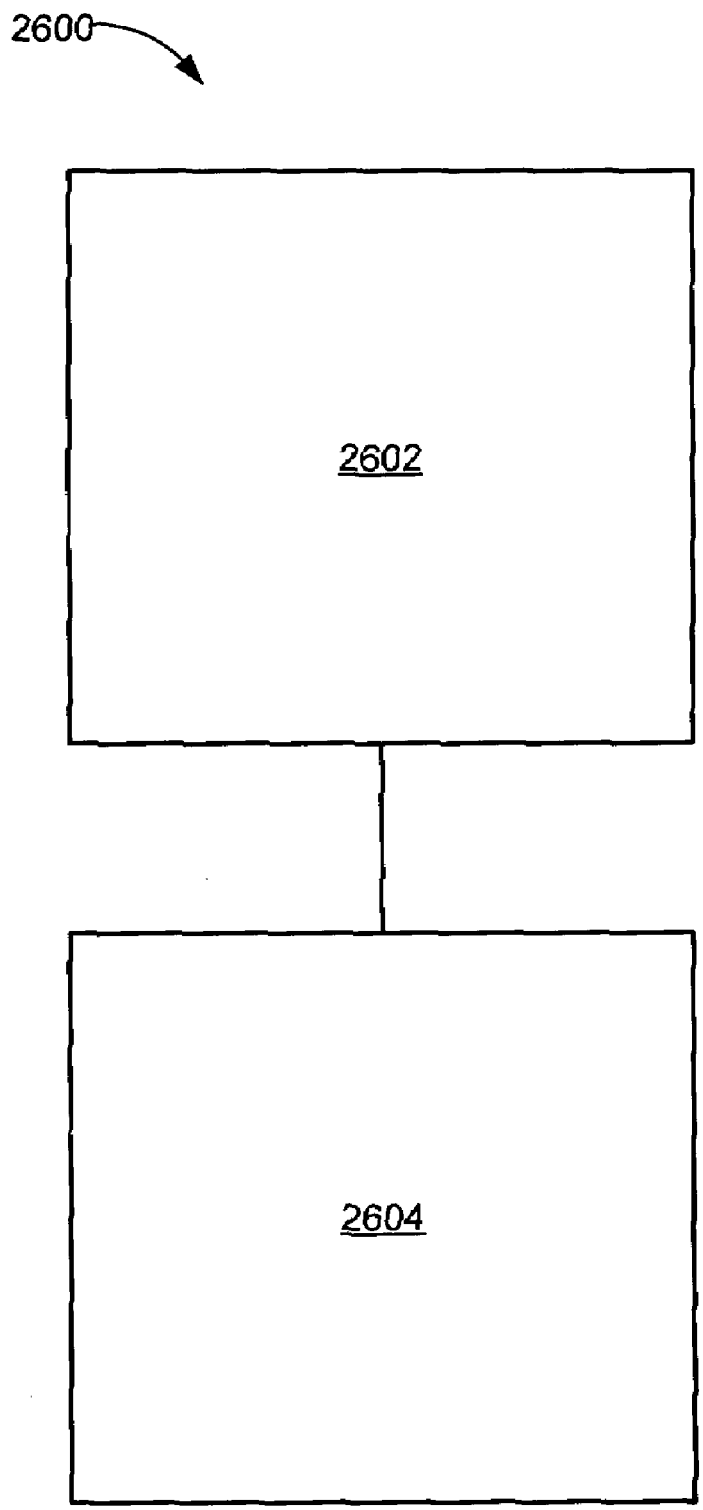
FIG. 26 is a flow chart of a method for stacked die packaging in accordance with the present invention.

Referring now to FIG. 26, therein is shown a flow chart of a method 2600 for stacked die packaging in accordance with the present invention. The method 2600 includes providing a leadframe configured for supporting a lower semiconductor die, in a block 2602; and forming at least one pillar on the leadframe for supporting an upper semiconductor die, the pillar being formed integrally with and of the same material as the leadframe, and sized to have a predetermined height that is higher than the height of such a lower semiconductor die plus the height of bonding wires for such a lower semiconductor die plus a predetermined spacing between such bonding wires and the bottom of an upper semiconductor die to be supported on the at least one pillar, in a block 2604.

The invention thus provides a useful method and structure for increasing package efficiency and capacity, and hence reducing the package thickness. As described, embodiments of the invention provide a stacked semiconductor die assembly that includes a first semiconductor die that is attached on the die attach pad with the active pads electrically interconnected to the leadframe through bonding wires. A second semiconductor die is attached on the integral pillars that have been mechanically fabricated in the leadframe to allow the second semiconductor die to sit firmly and steadily thereon. Bonding pads on the second semiconductor die are then interconnected to the leadframe by bonding wires. Additional pillars and semiconductor dies may also be included as desired or needed. The package is then encapsulated with a molding compound.

It has been discovered that the present invention thus has numerous advantages. For example, it enables and supports high package capacity, efficiency, and performance.

Another advantage is that it enables full die pad wire bonding while reducing package thickness.

An additional advantage is that it affords high levels of integration and package density.

A still further advantage is that the present invention facilitates enhancing the circuit capabilities by incorporating multiple dies that can thus support multiple functions in a single package, while reducing the package volume.

Another advantage is that the invention is uncomplicated and thus amenable to lower-cost, rapid volume fabrication and manufacturing.

Thus, it has been discovered that the stacked die packaging method and apparatus of the present invention furnish important and heretofore unknown and unavailable solutions, capabilities, and functional advantages for increasing package efficiency and capacity and reducing package thicknesses. The resulting processes and configurations are straightforward, economical, uncomplicated, highly versatile and effective, can be implemented by adapting known technologies, and are thus readily suited for manufacturing stacked die packages.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for stacked die packaging, comprising:
   providing a leadframe configured for supporting a lower semiconductor die on the top thereof, the leadframe having a die attach pad and leadfingers disposed and supported around the periphery of the die attach pad;
   stamping and forming pillars in the leadframe around the die attach pad for supporting an upper semiconductor die on the pillars above the lower semiconductor die, the pillars being formed integrally with and of the same material as the leadframe, and sized to have a predetermined height that is higher than the height of such a lower semiconductor die plus the height of bonding wires for such a lower semiconductor die plus a predetermined spacing between such bonding wires and the bottom of an upper semiconductor die to be supported on the pillars;
   attaching such a lower semiconductor die to the die attach pad with adhesive;
   wire-bonding the lower semiconductor die to the leadfingers with bonding wires;
   attaching an upper semiconductor die to the pillars with adhesive;
   wire-bonding the upper semiconductor die to the leadfingers with bonding wires; and
   packaging at least the lower and upper semiconductor dies and the bonding wires in an encapsulant.

2. The method of claim 1 wherein stamping and forming pillars in the leadframe further comprises stamping and forming the pillars in the leadframe at the corners thereof.

3. The method of claim 1 wherein stamping and forming pillars in the leadframe further comprises stamping and forming the pillars from the leadfingers.

4. The method of claim 1 wherein stamping and forming pillars in the leadframe further comprises stamping and forming the pillars in the die attach pad therearound.

5. The method of claim 1 wherein stamping and forming pillars in the leadframe further comprises stamping and forming outer pillars and inner pillars sized to have respective predetermined heights for supporting an intermediate semiconductor die and such an upper semiconductor die with such an intermediate semiconductor die supported between such an upper semiconductor die and such a lower semiconductor die.

6. Apparatus for stacked die packaging, comprising:
   a leadframe configured for supporting a lower semiconductor die on the top thereof, the leadframe having a die attach pad and leadfingers disposed and supported around the periphery of the die attach pad;
   pillars stamped and formed in the leadframe around the die attach pad for supporting an upper semiconductor die on the pillars above the lower semiconductor die, the pillars being formed integrally with and of the same material as the leadframe, and sized to have a predetermined height that is higher than the height of such a lower semiconductor die plus the height of bonding wires for such a lower semiconductor die plus a predetermined spacing between such bonding wires and the bottom of an upper semiconductor die to be supported on the pillars;
   adhesive attaching such a lower semiconductor die to the die attach pad;
   bonding wires wire-bonding the lower semiconductor die to the leadfingers;
   adhesive attaching an upper semiconductor die to the pillars;
   bonding wires wire-bonding the upper semiconductor die to the leadfingers; and
   an encapsulant packaging at least the lower and upper semiconductor dies and the bonding wires.

7. The apparatus of claim 6 wherein the pillars are stamped and formed in the leadframe at the corners thereof.

8. The apparatus of claim 6 wherein the pillars are stamped and formed in the leadframe from the leadfingers.

9. The apparatus of claim 6 wherein the pillars are stamped and formed in the leadframe in the die attach pad therearound.

10. The apparatus of claim 6 further comprising outer pillars and inner pillars formed integrally with and of the same material as the leadframe, and sized to have respective predetermined heights for supporting an intermediate semiconductor die and such an upper semiconductor die with such an intermediate semiconductor die supported between such an upper semiconductor die and such a lower semiconductor die.

* * * * *

UNITED STATES PATENT AND TRADEMARK OFFICE
CERTIFICATE OF CORRECTION

| | | |
|---|---|---|
| PATENT NO. | : 7,381,593 B2 | Page 1 of 1 |
| APPLICATION NO. | : 10/913806 | |
| DATED | : June 3, 2008 | |
| INVENTOR(S) | : Ararao et al. | |

It is certified that error appears in the above-identified patent and that said Letters Patent is hereby corrected as shown below:

<u>Title page, item (75), under Inventors</u>:

delete "Harvey Kong," and insert therefore --Harvey Kong Ling Kwong,--

Signed and Sealed this

Twenty-first Day of October, 2008

JON W. DUDAS
*Director of the United States Patent and Trademark Office*